(12) United States Patent
Chang

(10) Patent No.: US 8,802,354 B2
(45) Date of Patent: *Aug. 12, 2014

(54) WATER MARK DEFECT PREVENTION FOR IMMERSION LITHOGRAPHY

(71) Applicant: Taiwan Semiconductor Manufacturing Company, Ltd., Hsinchu (TW)

(72) Inventor: Ching-Yu Chang, Yuansun Village (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/857,453

(22) Filed: Apr. 5, 2013

(65) Prior Publication Data

US 2013/0216949 A1 Aug. 22, 2013

Related U.S. Application Data

(63) Continuation of application No. 13/079,942, filed on Apr. 5, 2011, now Pat. No. 8,415,091, which is a continuation of application No. 11/271,639, filed on Nov. 10, 2005, now Pat. No. 7,927,779.

(60) Provisional application No. 60/722,646, filed on Sep. 30, 2005.

(51) Int. Cl.
*G03F 7/004* (2006.01)
*G03F 7/039* (2006.01)
*G03F 7/26* (2006.01)

(52) U.S. Cl.
USPC ........................................ 430/270.1; 430/326

(58) Field of Classification Search
USPC ........................................ 430/270.1, 322, 326
See application file for complete search history.

(56) References Cited

U.S. PATENT DOCUMENTS

| | | | |
|---|---|---|---|
| 5,212,047 A | 5/1993 | Hertler et al. | |
| 5,599,650 A | 2/1997 | Bi et al. | |
| 5,683,856 A | 11/1997 | Aoai et al. | |
| 6,153,349 A | 11/2000 | Ichikawa et al. | |
| 6,713,236 B2 | 3/2004 | Chen | |
| 6,781,670 B2 | 8/2004 | Krautschik | |
| 6,788,477 B2 | 9/2004 | Lin | |
| 6,828,079 B2 | 12/2004 | Seutsugu et al. | |
| 6,849,378 B2 | 2/2005 | Choi et al. | |
| 6,929,891 B2 | 8/2005 | Rushkin et al. | |
| 7,090,963 B2 | 8/2006 | Medeiros et al. | |
| 7,125,643 B2 | 10/2006 | Harada et al. | |
| 7,169,529 B2 | 1/2007 | Shibuya | |
| 7,192,681 B2 | 3/2007 | Fujimori | |
| 7,264,918 B2 | 9/2007 | Endo et al. | |
| 7,384,730 B2 | 6/2008 | Hata et al. | |
| 7,396,633 B2 | 7/2008 | Nagahara et al. | |
| 7,419,759 B2 | 9/2008 | Kim et al. | |
| 7,459,264 B2 | 12/2008 | Kawamura et al. | |
| 7,461,119 B2 | 12/2008 | Mukundan et al. | |
| 7,463,330 B2 | 12/2008 | Streefkerk et al. | |
| 7,473,512 B2 | 1/2009 | Houlihan et al. | |
| 7,479,361 B2 | 1/2009 | Nagahara et al. | |
| 7,498,118 B2 | 3/2009 | Kim | |
| 7,524,618 B2 | 4/2009 | Ito | |
| 7,678,527 B2 | 3/2010 | Meagley et al. | |
| 7,700,267 B2 | 4/2010 | Yeo et al. | |
| 7,776,505 B2 | 8/2010 | Gonsalves | |
| 7,804,574 B2 | 9/2010 | Streefkerk et al. | |
| 7,892,722 B2 | 2/2011 | Inabe et al. | |
| 7,927,779 B2 | 4/2011 | Chang | |
| 8,415,091 B2 * | 4/2013 | Chang | 430/322 |
| 2004/0102646 A1 | 5/2004 | Watanabe et al. | |
| 2004/0267005 A1 | 12/2004 | Yerxa et al. | |
| 2005/0029492 A1 | 2/2005 | Subawalla et al. | |
| 2005/0051930 A1 | 3/2005 | Kawakami et al. | |
| 2005/0202351 A1 | 9/2005 | Houlihan et al. | |
| 2006/0068318 A1 | 3/2006 | Meagley et al. | |
| 2007/0002296 A1 | 1/2007 | Chang | |
| 2007/0006405 A1 | 1/2007 | Feng et al. | |
| 2007/0031760 A1 | 2/2007 | Chang et al. | |
| 2007/0077517 A1 | 4/2007 | Chang | |
| 2010/0258789 A1 | 10/2010 | Akai et al. | |
| 2011/0183273 A1 | 7/2011 | Chang | |

FOREIGN PATENT DOCUMENTS

| | | |
|---|---|---|
| CN | 1235281 | 11/1999 |
| CN | 1407405 | 4/2003 |
| EP | 1033624 | 9/1999 |
| EP | 1522894 | 4/2005 |
| EP | 1601008 | 11/2005 |
| EP | 1662323 | 5/2006 |

(Continued)

OTHER PUBLICATIONS

Japanese Patent Office, Office Action of Nov. 9, 2009, Application No. 2006-212576, 2 pgs.

(Continued)

*Primary Examiner* — Anca Eoff
(74) *Attorney, Agent, or Firm* — Haynes and Boone, LLP

(57) ABSTRACT

A photoresist material having a polymer that turns soluble to a base solution in response to reaction with acid. The material includes a photo-acid generator (PAG) that decomposes to form acid in response to radiation energy and a quencher capable of neutralizing acid and having a reduced mobility. The photoresist material can thereby prevent water mark defects from immersion lithography.

19 Claims, 12 Drawing Sheets

(56) References Cited

FOREIGN PATENT DOCUMENTS

| | | |
|---|---|---|
| JP | 07134419 | 5/1995 |
| JP | 07146558 | 6/1995 |
| JP | 0916244 | 6/1997 |
| JP | 200109142 | 4/2001 |
| JP | 2001337448 | 12/2001 |
| JP | 2003140360 | 5/2003 |
| JP | 2003167345 | 6/2003 |
| JP | 2005081302 | 3/2005 |
| JP | 2005101487 | 4/2005 |
| JP | 2005101498 | 4/2005 |
| JP | 2005128455 | 5/2005 |
| JP | 2005157259 | 6/2005 |
| JP | 2005264131 | 9/2005 |
| JP | 200624692 | 1/2006 |
| JP | 2006276851 | 10/2006 |
| JP | 2007304545 | 11/2007 |
| TW | 581930 | 4/2004 |
| TW | 233539 | 6/2005 |
| WO | WO-0291084 | 5/2002 |
| WO | WO-2004079800 | 9/2004 |
| WO | WO-2004081666 | 9/2004 |
| WO | WO-2004088429 | 10/2004 |
| WO | WO-2005013007 | 2/2005 |
| WO | WO-2005019937 | 3/2005 |
| WO | WO-2005024325 | 3/2005 |
| WO | WO-2005081063 | 9/2005 |
| WO | WO-2005088397 | 9/2005 |

OTHER PUBLICATIONS

Israeli Patent Office, Office Action of Feb. 9, 2010, Application No. 178317, 2 pgs. (English translation, 2 pgs).

NL Patent Office, Office Action dated Sep. 2, 2010, Application No. N2002950, 14 pgs.

Chinese Patent Office, Office Action dated Dec. 11, 2009, Application No. 2006101524283, 63 pgs.

Japanese Patent Office, Notification of Reasons for Refusal of Jan. 13, 2009, Application No. 2006/186,926, 12 pgs.

Japanese Patent Office, Office Action of Nov. 24, 2009, Application No. 2007-146915, 12 pgs.

Japanese Patent Office, Office Action of Jul. 6, 2009, Application No. 2006-212576, 4 pgs. (English translation, 3 pgs.).

Chinese Patent Office, Office Action of Jun. 26, 2009, Application No. 2006101524283, 4 pgs.

Taiwanese Patent Office, Office Action dated May 19, 2010, Application No. 200910150015.5, 5 pgs.

French Patent Office, Office Action dated Jun. 22, 2010, Application No. 0608609, 8 pgs.

Chinese Patent Office, Office Action, Application No. 2006-101524298 dated May 22, 2009, 5 pgs.

German Patent Office, Office Action, Application No. 10 2006 046453.2-51 dated Apr. 15, 2009, 8 pgs. (English translations—9 pgs.).

Jung et al., Top Antireflective Coating Process for Immersion Lithography, Advances in Resist Technology and Processing XXII, Proceedings of SPIE vol. 5753, Bellingham, WA, pp. 519-526, 2005.

European Patent Office, Novelty Search Report dated Apr. 10, 2007, Dutch patent application 1032276, 9 pgs.

Novelty Search Report dated Jun. 28, 2006, Dutch patent application 1032068, 5 pgs.

U.S. Appl. No. 60/695,562, "Immersion Lithography Defect Reduction", Inventor—Chang, filed Jun. 30, 2005, 13 pgs.

U.S. Appl. No. 60/705,795, "Immersion Lithography Watermark Reduction", Inventor—Chang, filed Aug. 5, 2005, 14 pgs.

U.S. Appl. No. 60/722,316, "Novel TARC Material for Immersion Watermark Reduction", Inventor—Chang, filed Sep. 30, 2005, 15 pgs.

U.S. Appl. No. 60/722,646, "Watermark Defect Prevention for Immersion Lithography," Inventor—Chang, filed Sep. 30, 2005, 14 pgs.

\* cited by examiner

WATER MARK DEFECT PREVENTION FOR IMMERSION LITHOGRAPHY

PRIORITY DATA

This application is a continuation application of U.S. patent application Ser. No. 13/079,942, filed Apr. 5, 2011, which is a continuation of U.S. patent application Ser. No. 11/271,639, filed Nov. 10, 2005, now U.S. Pat. No. 7,927,779, which claims priority to U.S. provisional patent application No. 60/722,646, filed Sep. 30, 2005, entitled "Water Mark Defect Prevention for Immersion Lithography," each of which is hereby incorporated by reference in its entirety.

BACKGROUND

As semiconductor fabrication technologies are continually progressing to smaller feature sizes such as 65 nanometers, 45 nanometers, and below, immersion lithography processes are being adopted. However, immersion lithography processes induce water drop residue after an exposure process. Such water drop residue can cause water mark defects and therefore degrade or even cause failures during semiconductor fabrication.

What is needed is an improved immersion lithography system where the damage caused by water mark defects are prevented and/or reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
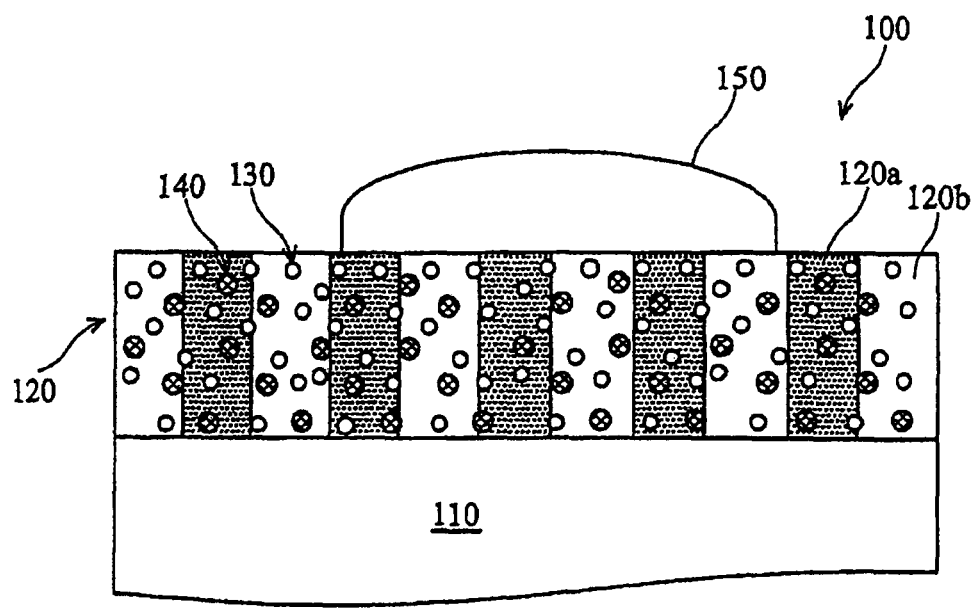
FIG. 1 illustrates a sectional view of one exemplary semiconductor device 100 having a photo sensitive layer being exposed during an immersion lithography process.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed interposing the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 provides a sectional view of a semiconductor device 100 during an immersion lithography exposing process. The semiconductor device 100 may be a semiconductor wafer or other suitable device. In the present embodiment, the semiconductor device 100 includes a silicon substrate 110 having organic bottom anti reflecting coating(BARC), inorganic bottom anti reflective layer, etch resistance organic layer, adhesion enhancement organic layer, various doped regions, dielectric features, and multilevel interconnects. The substrate may alternatively include other suitable semiconductor material, including Ge, SiGe, or GaAs. The substrate may alternatively include a non-semiconductor material such as a glass plate for thin-film-transistor liquid crystal display (TFT-LCD) devices. The semiconductor device 100 may further include one or more material layers to be patterned.

The semiconductor device 100 includes a photo sensitive layer (photoresist or resist) 120. In the present embodiment, the resist layer 120 has a thickness ranging between about 50 angstroms and 5000 angstroms. In another embodiment, the resist layer 120 may have a thickness ranging between about 500 angstroms and 2000 angstroms. The resist layer 120 utilizes a chemical amplification (CA) resist material. The resist layer 120 includes a polymer material that turns soluble to a developer such as a base solution when the polymer is reacted with acid. The resist layer 120 includes a polymer material that turns insoluble to a developer such as a base solution when the polymer is reacted with acid. The resist 120 further includes a solvent filling inside the polymer. The solvent may be partially evaporated due to a prior baking process. The resist 120 also includes a photo-acid generator (PAG) 130 material, with PAG molecules distributed inside the solvent and/or polymer. When absorbing photo energy, the PAG 130 decomposes and forms a small amount of acid. The PAG 130 may have a concentration ranging between about 1% and 15% wt of the resist polymer 120.

In furtherance of the present embodiment, the resist 120 also includes a quencher material 140 that distributes inside the solvent and polymer. The quencher 140 is a base type and is capable of neutralizing acid. Collectively or alternatively, the quencher may inhibit other active component of the resist 120, such as inhibiting PAG and photo acid from reaction. The quencher 140 may have a concentration ranging between 0.5% and 8% wt of the resist. The quencher 140 may alternatively have a concentration about one fourth of the concentration of the PAG 130 by weight before the exposing process. In one example, the quencher 140 includes a nitrogen atom having an unpaired electron capable of neutralizing an acid. In an exposure processing step during an immersion photolithographic patterning, the resist layer 120 is exposed to a radiation energy such as deep ultra-violet (DUV) through a photomask (mask or reticle) having a predefined pattern, resulting in a resist pattern that includes a plurality of unexposed regions such as unexposed features 120a and a plurality of exposed regions such as exposed features 120b. The radiation energy may include a 248 nm beam by Krypton Fluoride (KrF) excimer lasers or a 193 nm beam by Argon Fluoride (ArF) excimer lasers. The immersion lithography further includes an immersion fluid between the semiconductor device 100 and a lens of a lithography system used to implement the exposure processing step. The immersion fluid may include de-ionized water (DI water or DIW). The fluid may further include chemical additives such as acid, salt, or polymer. The fluid may alternatively include other suitable fluid having an index of refraction higher than 1.44, the index of refraction of DIW. During an exposing process, water drop residue, such as an exemplary water drop 150, may be left on the resist layer after the exposing process.

Figure 2:
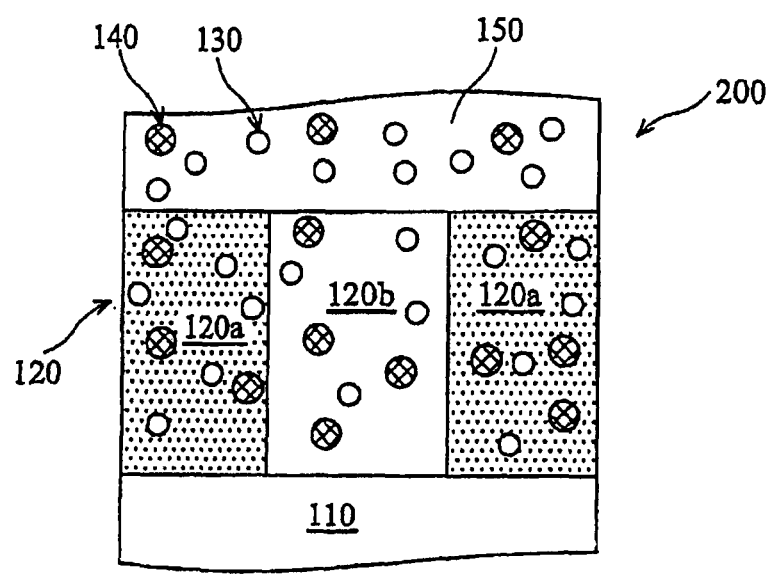
FIGS. 2 and 3 illustrate sectional views of one exemplary semiconductor device having photo sensitive layer and watermark formed thereon during immersion lithography processes.
Figure 3:
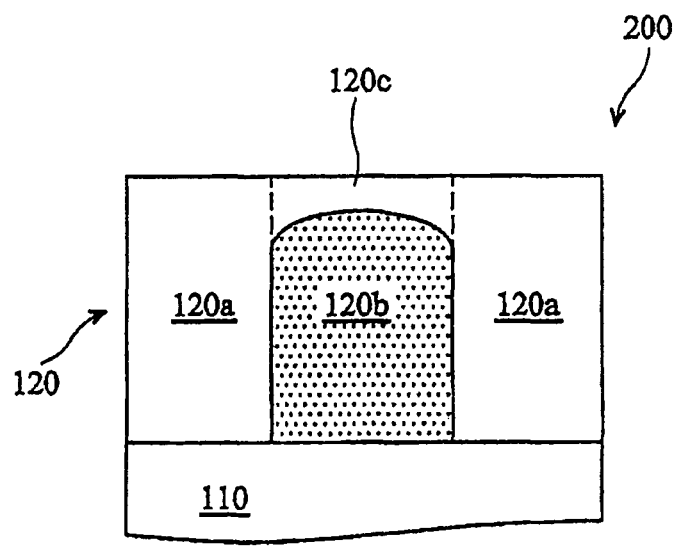

In previous immersion lithography patterning processes, the water drop residue may cause problems such as forming a watermark as illustrated in sectional views of a semiconductor device 200 of FIGS. 2 and 3. A water drop 130 left on a photo sensitive layer 120 of the semiconductor device 200 may provide a path to PAG 130 and quencher 140. The quencher 140 in unexposed resist region 120*a* may diffuse into the water drop and further diffuse into the exposed resist region 120*b*, thereby neutralizing the photo generated acid and/or reducing exposure efficiency in the exposed areas. Furthermore, the exposed PAG is decomposed as PAG anion and acid, which is more soluble to water than unexposed PAG. The photo generated acid may diffuse into the water drop with additional effect such that the exposed areas of the resist 120 have reduced photo generated acid. These exposed areas of the resist layer 120 thus may have no sufficient photo generated acid to induce a cascade of chemical transformation (acid amplification) after the exposing process step, and/ or may not be fully soluble in developing solution at a developing process step. Thus an unexpected T-top resist feature (bridge profile or watermark) 120*c* may be formed on the exposed regions of the resist layer 120 in which the top resist material of the exposed region is not soluble in a developing solution.

According to the present disclosure, the quencher 140 has reduced mobility such that the diffusion through the water drop is substantially reduced. In one example, the mobility of the quencher is reduced such that the quencher is capable of being leached less than about $10^{-13}$ mole/cm$^2$ to an immersion fluid during immersion lithography.

Figure 4:
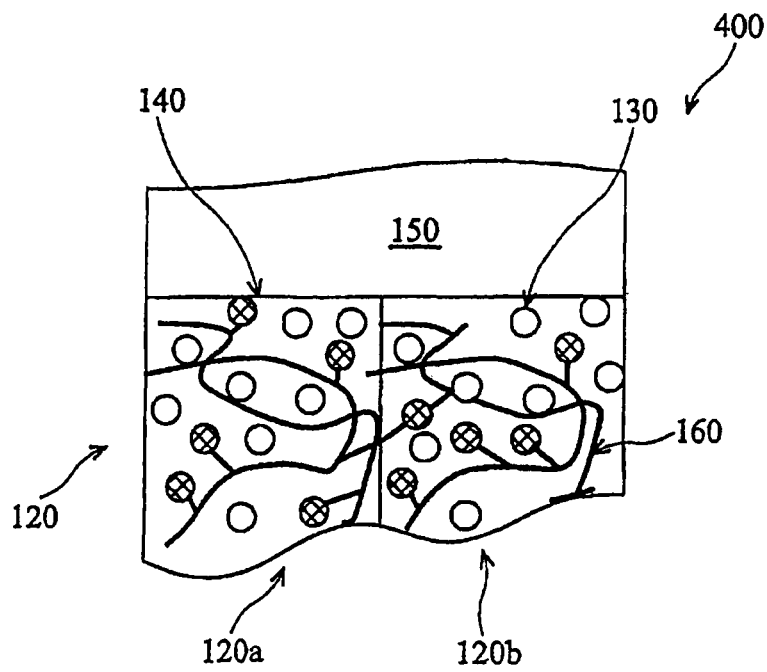
FIG. 4 illustrates a schematic view of a photo sensitive layer having chemically bonded quenchers.

In one embodiment as illustrated in FIG. 4, the quencher 140 is chemically bonded to a polymer 160 such that the quencher has a reduced mobility. The polymer 160 becomes soluble in a developing solution after reacting with acid. The polymer 160 further includes a short chain polymer, which is soluble to developing solution. The quencher 140 is not able to diffuse into the water drop, resulting in a limited range of mobility through a chain movement of the polymer 160 and/ or quencher 140.

Figure 5A:
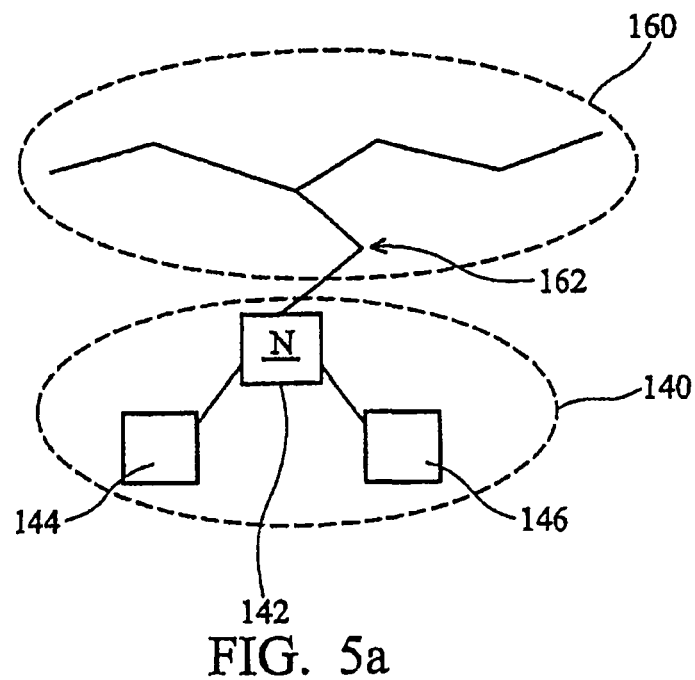
FIGS. 5a to 5c illustrate schematic views of various embodiments of a photo sensitive layer having a polymer and quenchers chemically bonded to the polymer.
Figure 5B:
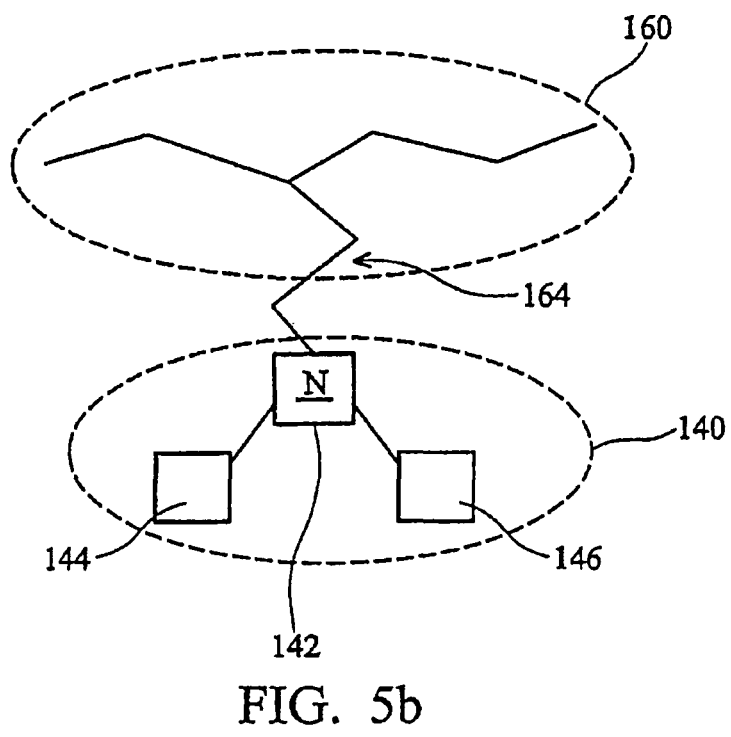
Figure 5C:
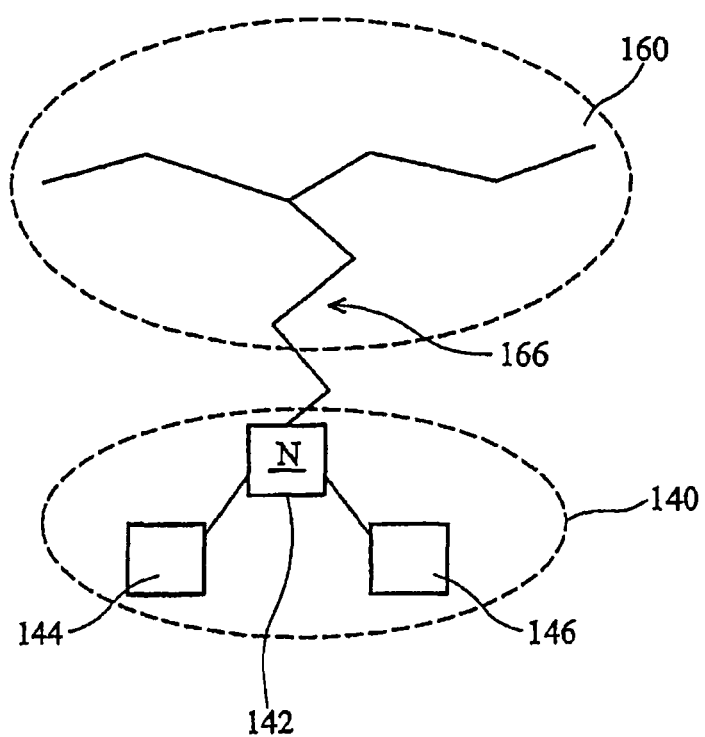

Referring to FIG. 5*a*, the quencher 140 may be bonded to a carbon unit 162 of the polymer 160 through a nitrogen atom 142 of the quencher. In the present embodiment, the nitrogen atom 142 includes an unpaired electron to neutralize acid or other active component of the resist. The quencher 140 includes first and second chemical groups 144, 146 such as alkyl groups bonded to the nitrogen atom 142. An alkyl group may include H, CH3, C2H5, CF3, C2F5, ring type polymer or ring type polymer with its ring end bond to nitrogen atom 142. The first and second chemical groups 144 and 146 may alternatively include other chemical groups. In other examples, the polymer 160 may include two carbon units 164 in FIG. 5*b*, or three carbon units 166 in FIG. 5*c*, or even more carbon units bonded to the nitrogen 142 of the quencher. Such carbon structure has multiple carbon units in chain and provides a certain flexibility to the bonded quencher 140. The polymer may alternatively include other atomic units bonded to the quencher 140.

Figure 6:
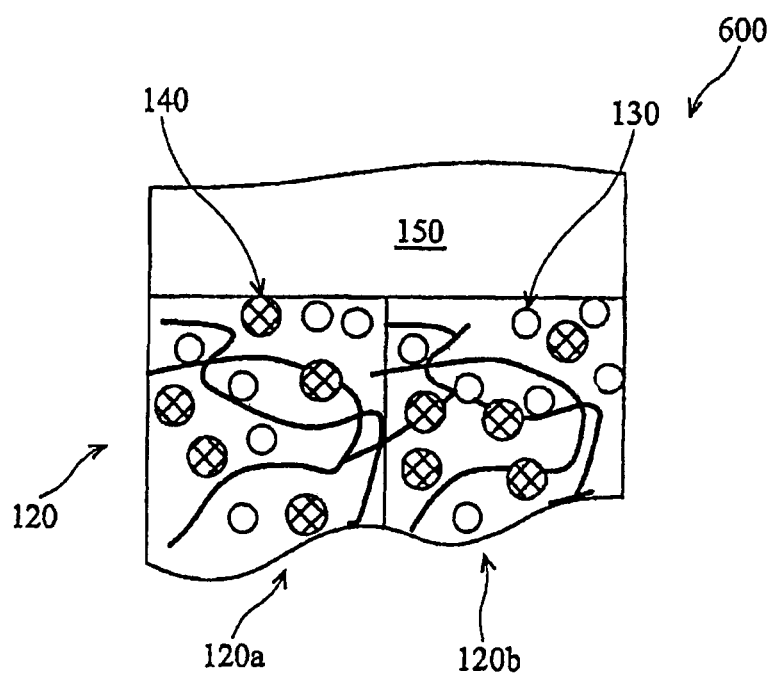
FIG. 6 illustrates a schematic view of a photo sensitive layer having physically trapped quenchers.
Figure 7A:
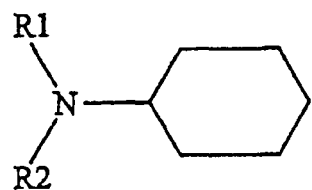
FIGS. 7a to 7j illustrate schematic views of various embodiments of a photo sensitive layer having quenchers with reduced mobility.
Figure 7B:
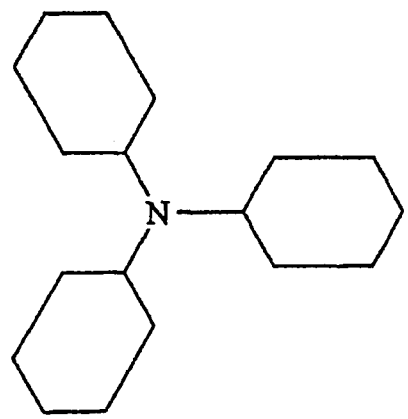
Figure 7C:
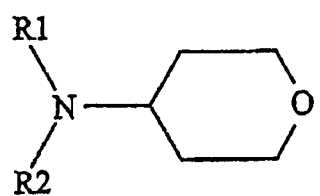
Figure 7D:
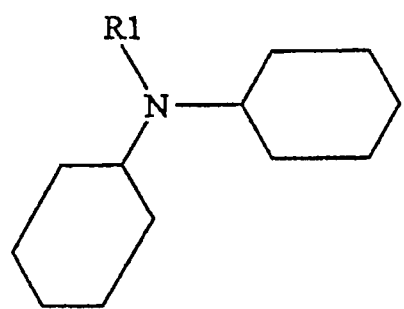
Figure 7E:
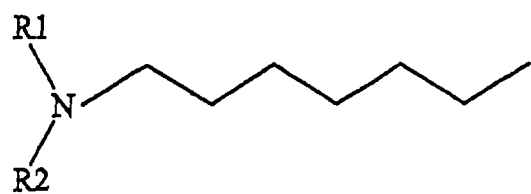
Figure 7F:
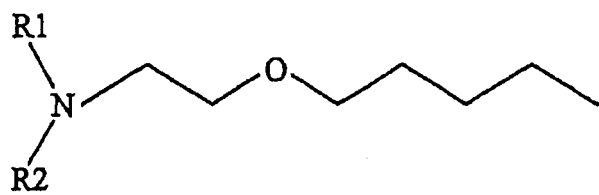
Figure 7G:
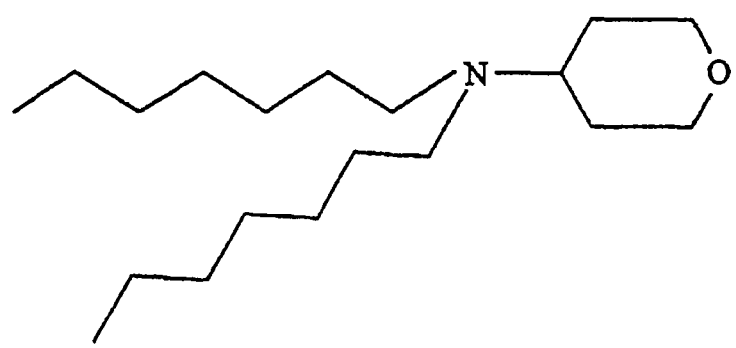
Figure 7H:
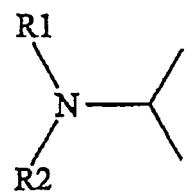
Figure 7I:
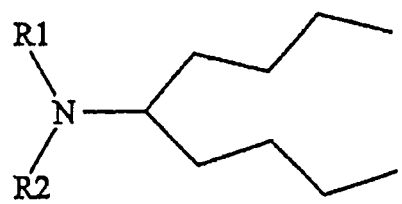
Figure 7J:
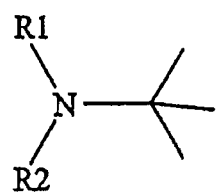

Referring to FIG. 6, in another embodiment, the quencher 140 may be physical trapped (fully or partially) inside the polymer 160. The quencher 140 may have a size substantially large compared to an average mesh size of the network of the polymer 160 so that the quencher 140 is physically trapped inside. The quencher 140 may alternatively have a certain structural group to enhance physical entanglement. For example, the quencher 140 may include a long chain or a branched group such that the quencher 140 may be physically tangled with or trapped by the polymer 160. In another embodiment, the quencher 140 may include a ring structure, a long chain, a branched group, or combinations thereof, to reduce the quencher mobility.

FIGS. 7*a* through 7*j* illustrates various exemplary structures of the quencher. A quencher in FIG. 7*a* includes two alkyl groups and a ring structure such as a carbon ring. A quencher in FIG. 7*d* includes one alkyl group and two ring structures. A quencher in FIG. 7*b* includes three ring structures. A quencher in FIG. 7*c* includes two alkyl groups and one ring structures having an oxygen atom. A quencher in FIG. 7*e* includes two alkyl groups and a long chain such as a carbon chain. A quencher in FIG. 7*f* includes two alkyl groups and a long chain having an oxygen atom. A quencher in FIG. 7*g* includes one ring structure having an oxygen and two long-chain structures. A quencher in FIG. 7*h* includes two alkyl groups and one branched structure having two short chains. A quencher in FIG. 7*i* includes two alkyl groups and one branched structure having two long chains. A quencher in FIG. 7*j* includes two alkyl groups and one branched structure having three short chains. Other combinations may be implemented to tune the mobility of the quencher for optimized performance.

Figure 8A:
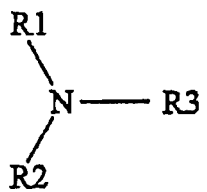
FIGS. 8a to 8b illustrate schematic views of various embodiments of a photo sensitive layer having hydrophobic quenchers.
Figure 8B:
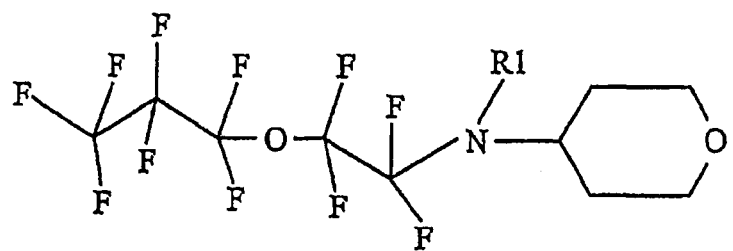

Referring to FIGS. 8*a* and 8*b*, in another example, the quencher is hydrophobic and therefore difficult to diffuse to a water drop. The quencher may include at least one hydrophobic group. For example, the quencher includes a fluoride. The quencher in FIG. 8*a* includes three alkyl groups and at least one of them has a fluoride. The quencher in FIG. 8*b* includes one alkyl group, one ring having an oxygen, and a long chain having multiple fluoride.

In another embodiment, water drops left on the resist layer may be acid treated right after the exposing process. The acid treatment can be implemented by spraying acid on the resist surface (and/or the water drops thereon) through a chemical inlet integral to the immersion lithography system. The pH value of the treated water drops may be adjusted to a value below about 6. Thus, the quencher has a reduced rate of diffusion into the water drop. Furthermore, photo generated acid may also have a reduced rate of diffusion to the water drop. The acid treatment can also diffuse into the resist film and substantially compensate the leaching of the photo acid.

In various embodiments, the mobility of the quencher to the water drop on the resist layer is substantially reduced. The watermark effect is also substantially reduced. Various embodiments may be modified or combined for optimized resist patterning process.

Figure 9:
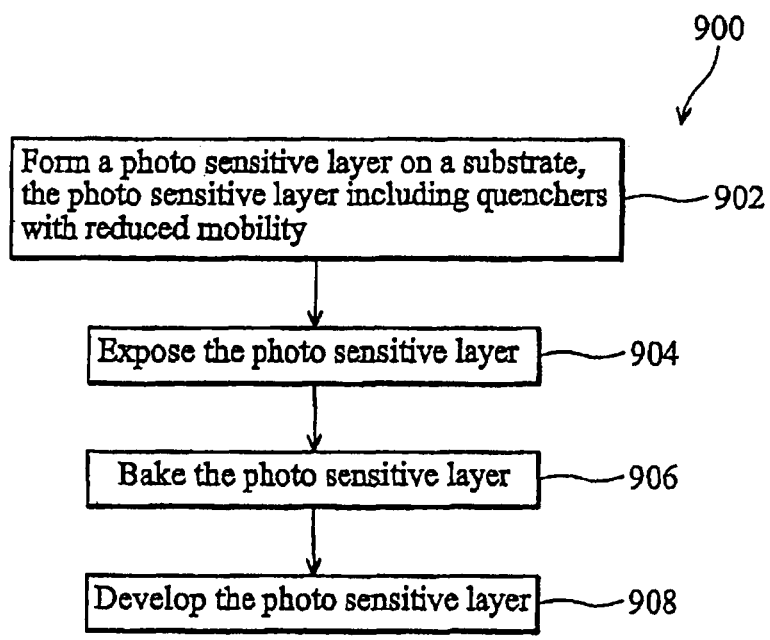
FIG. 9 is a flowchart of one embodiment of a method of immersion photolithography patterning.

Referring to FIG. 9, a flowchart of an immersion lithography method 900 form a resist pattern as described. The method 900 includes a step 902 to form a photo sensitive (resist) layer on a semiconductor wafer. The resist layer is substantially similar to the resist layer 120 of FIG. 1, where the quencher material has a reduced mobility. The quencher may have structures similar to those illustrated in FIGS. 5a to 5c, FIGS. 7a to 7j, and FIGS. 8a to 7b, or combinations thereof.

The method 900 further includes a step 904 to expose the resist layer to a radiation energy such as DUV through a photomask and an immersion fluid. The immersion fluid may be DIW or other suitable fluid having a high index of reaction and is disposed between the semiconductor wafer and lens of an immersion lithography system to implement the method 900. Since the quencher has a reduced mobility, the quencher has a reduced leaching to water drops left on the resist layer after the exposing step 904.

The method 900 then proceeds to a step 906 to bake (post exposure bake or PEB) the resist layer. The baking temperature may range between about 80° C. and 150° C. The baking may have a duration of several minutes as an example. The baking step may further include removing water drops left on the resist layer.

The method 900 then proceeds to a step 908 to develop the resist layer in a developing solution. The exposed resist regions are substantially dissolved.

The method 900 may further include a step between the exposing step 904 and the baking step 906 to treat the water drops left on the resist layer so that the water drops will have pH value below 6. Such acid treated water drops may also neutralize the diffusion of the base quencher to the water drop. This can reduce the impact of the diffusion of the quencher to the exposed resist regions through the water drops and also reduce the diffusion of the acid from the exposed resist regions into the water drops.

Thus, the present disclosure provide a photoresist material having a polymer that turns soluble to a base solution in response to reaction with acid. The material includes a photo-acid generator (PAG) that decomposes to form acid in response to radiation energy and a quencher capable of neutralizing acid and having a reduced mobility.

In some embodiments, the quencher includes a concentration greater than about 0.5% of the polymer by weight. The quencher may be capable of being leached at an amount less than about $5 \times 10^{-13}$ mole/cm$^2$ to an immersion fluid. The immersion fluid may include water. The immersion fluid may include a suitable fluid having an index of refraction (n) higher than 1.44. The quencher may be chemical bonded to the polymer. The polymer may include at least one carbon unit bonded to the quencher. The at least one carbon unit may be bonded to a nitrogen atom of the quencher. The quencher may include a nitrogen atom having an unpaired electron. The quencher may include at least one ring structure attached to the nitrogen atom. The quencher may include at least one of four-carbon chain attached to the nitrogen atom. The quencher may comprise at least four atom units attached to the nitrogen atom of the quencher. The quencher may include at least one branch chain attached to the nitrogen atom of the quencher. The quencher may be substantially hydrophobic. The quencher may include fluoride.

The present disclosure also provides a material having a polymer that turns soluble to a base solution in response to reaction with acid. The material includes a plurality of photo-acid generators (PAGs) that decompose to form acid in response to radiation energy; and a plurality of quenchers that are capable of neutralizing acid and have a reduced mobility by at least one of:
  being chemically bonded to the polymer;
  being substantially hydrophobic; and
  physically trapped in the polymer.

In some embodiments, the plurality of quenchers include a concentration about one fourth of a concentration of the plurality of PAGs. Each of the plurality of quencher may include a nitrogen atom having one unpaired electron. Each of the plurality of quencher may include an chemical group bonded to the nitrogen, wherein the chemical group is selected from the group consisting of an alkyl group, a ring structure, a long chain, a branched group, and combinations thereof. The plurality of quenchers may include a reduced mobility such that the plurality of quenchers is capable of being leached less than about $5 \times 10^{-13}$ mole/cm$^2$ to an immersion fluid. The material may further include a solvent in the polymer.

The present disclosure also provides a method for immersion lithography. The method includes forming a photo sensitive layer on a substrate, the photo sensitive layer including: a polymer that turns soluble to a base solution in response to reaction with acid; a plurality of photo-acid generators (PAGs) that decompose to form acid in response to radiation energy; and a plurality of quenchers capable of neutralizing acid and having a reduced mobility. The method includes exposing the photo sensitive layer using an immersion lens system; baking the photo sensitive layer, the photo sensitive layer being able to leach the plurality of quenchers less than about $5 \times 10^{-13}$ mole/cm$^2$ into an immersion fluid; and developing the photo sensitive layer. The method may further include an acid treatment such that pH value of water drops on the photo sensitive layer is below 6 after the exposing of the photo sensitive layer. In the method, the baking of photo sensitive layer may include removing water drops.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A material for use in immersion lithography, the material comprising:
  a polymer that turns soluble to a base solution in response to reaction with acid;
  a photo-acid generator (PAG) that decomposes to form an acid in response to a radiation energy; and
  a quencher capable of neutralizing acid and having a reduced mobility, wherein the quencher includes a structure selected from the group consisting of 1) at least two ring structures, 2) at least one carbon chain structure having at least four carbon atoms, and 3) one ring structure and two long chain structures, each long chain structure having at least two carbon atoms, and
  wherein the quencher is chemically bonded to the polymer.

2. The material of claim 1, wherein the quencher comprises three ring structures.

3. The material of claim 1, wherein the structure selected is the one ring structure and two long chain structures, and wherein the one ring structure includes an oxygen atom.

4. The material of claim 1, wherein the structure selected is the one ring structure and two long chain structures, and wherein each of the long chain structures has at least four carbon atoms.

5. The material of claim 1, wherein the structure selected is the at least one carbon chain structure having the at least four carbon atoms, and wherein the at least one carbon chain structure having the at least four carbon atoms is chemically bonded to a nitrogen atom and the nitrogen atom is further bonded to at least two alkyl groups.

6. The material of claim 5, wherein the structure selected is the at least one carbon chain structure having the at least four carbon atoms, and wherein the at least one carbon chain structure having the at least four carbon atoms further includes an oxygen atom.

7. The material of claim 1, wherein the quencher is capable of being leached at an amount less than about $5\times10^{-13}$ mole/$cm^2$ in an immersion fluid used in the immersion lithography.

8. A material for use in immersion lithography, comprising:
   a polymer that turns soluble to a base solution in response to reaction with acid;
   a photo-acid generator (PAG) that decomposes to form an acid in response to a radiation energy; and
   a quencher capable of neutralizing acid and having a reduced mobility, wherein the quencher includes a structure selected from the group consisting of 1) two ring structures and an alkyl group; 2) three ring structures; 3) one alkyl group and two ring structures; 4) two alkyl groups and a long chain, the long chain having at least two carbon atoms; 5) two alkyl groups and a long chain, the long chain having an oxygen atom and at least two carbon atoms; 6) one ring structure having an oxygen atom and two long chain structures, each long chain structure having at least two carbon atoms; 7) two alkyl groups and one branched structure having two short chains, each short chain having one carbon atom; 8) two alkyl groups and one branched structure having two long chains, each long chain having at least two carbon atoms; and 9) two alkyl groups and one branched structure having three short chains, each short chain having one carbon atom, and
   wherein the quencher is chemically bonded to the polymer.

9. The material of claim 8, wherein the quencher includes a nitrogen atom that is chemically bonded to a carbon unit of the polymer.

10. The material of claim 8, wherein the quencher has a concentration ranging from about 0.5% to about 8% of the material by weight.

11. The material of claim 8, wherein the quencher has a concentration of about 25% of a concentration of the PAG by weight.

12. The material of claim 8, wherein the PAG has a concentration ranging from about 1% to about 15% of the material by weight.

13. The material of claim 8, wherein the quencher includes a nitrogen atom having an unpaired electron.

14. A method comprising:
   forming a photo sensitive layer over a wafer, the photo sensitive layer including a quencher chemically bonded to a polymer, wherein the quencher includes a structure selected from the group consisting of 1) two ring structures and an alkyl group; 2) three ring structures; 3) one alkyl group and two ring structures; 4) two alkyl groups and a long chain, the long chain having at least two carbon atoms; 5) two alkyl groups and a long chain, the long chain having an oxygen atom and at least two carbon atoms; 6) one ring structure having an oxygen atom and two long chain structures, each long chain structure having at least two carbon atoms; 7) two alkyl groups and one branched structure having two short chains, each short chain having one carbon atom; 8) two alkyl groups and one branched structure having two long chains, each long chain having at least two carbon atoms; and 9) two alkyl groups and one branched structure having three short chains, each short chain having one carbon atom;
   immersing the photo sensitive layer in an immersion fluid; and
   exposing the photo sensitive layer to a radiation energy.

15. The method of claim 14, wherein the quencher has a leach rate with respect to the immersion fluid that is less than about $5\times10^{-13}$ mole/centimeter$^2$.

16. The method of claim 14, wherein the immersion fluid includes one of water or a fluid having an index of refraction (n) greater than 1.44.

17. The method of claim 14, further comprising applying acid having a pH value less than about 6 to the photo sensitive layer after exposing the photo sensitive layer.

18. The method of claim 17, further comprising baking the photo sensitive layer at a temperature range between about 80° C. and 150° C. after applying the acid.

19. The method of claim 14, wherein the photo sensitive layer further includes a photo-acid generator that decomposes to form an acid in response to the radiation energy.

* * * * *